United States Patent
Kaiho et al.

(10) Patent No.: US 7,463,090 B2
(45) Date of Patent: Dec. 9, 2008

(54) DRIVING DEVICE

(75) Inventors: Toshio Kaiho, Tokyo (JP); Junichi Machida, Tokyo (JP)

(73) Assignee: Asahi Kasei EMD Corporation, Tokyo (JP)

( * ) Notice: Subject to any disclaimer, the term of this patent is extended or adjusted under 35 U.S.C. 154(b) by 24 days.

(21) Appl. No.: 11/798,592

(22) Filed: May 15, 2007

(65) Prior Publication Data

US 2007/0273437 A1 Nov. 29, 2007

(30) Foreign Application Priority Data

| May 15, 2006 | (JP) | ............... 2006-135596 |
| Feb. 22, 2007 | (JP) | ............... 2007-042485 |

(51) Int. Cl.
*H03F 3/38* (2006.01)
(52) U.S. Cl. ........................ 330/10; 330/251
(58) Field of Classification Search ............ 330/10, 330/251, 207 A
See application file for complete search history.

(56) References Cited

U.S. PATENT DOCUMENTS

| 5,672,998 A | * | 9/1997 | Wittlinger | ............... 330/10 |
| 5,805,020 A | * | 9/1998 | Danz et al. | ............... 330/10 |
| 6,211,728 B1 | | 4/2001 | Chen et al. | |
| 6,229,389 B1 | * | 5/2001 | Pullen et al. | ............... 330/10 |
| 6,262,632 B1 | | 7/2001 | Corsi et al. | |
| 6,614,297 B2 | | 9/2003 | Score et al. | |
| 7,227,408 B2 | * | 6/2007 | Candy | ............... 330/10 |
| 7,355,473 B2 | * | 4/2008 | Wu | ............... 330/10 |

FOREIGN PATENT DOCUMENTS

JP 2006-203757 8/2006

OTHER PUBLICATIONS

Kaiho, T. et al., "Driving Device and Driving Method", pp. 1-47 and 27 sheets of drawings, U.S. Patent Application filed May 15, 2007.

* cited by examiner

*Primary Examiner*—Henry K Choe
(74) *Attorney, Agent, or Firm*—Finnegan, Henderson, Farabow, Garrett & Dunner, LLP

(57) ABSTRACT

Output signal waveform having high input signal reproducibility is outputted from inductive load or the like. Output signals V1a and V1b obtained by feeding back an output signal Vp-n1 at output terminals 50 and 51 across load L1 to input terminals 9a and 9b are compared with an input signal Vin to detect an error between signals; a first error suppression signal Vout1 is produced such that the detected error between the signals is suppressed; inclination of first error suppression signal Vout1 is detected, and a second error suppression signal Vout2 is produced such that inclination error to input signal Vin is suppressed based on the detected inclination signal; and the ratio between the period that electric power is supplied to the load L1 and the period that electric power is not supplied to the load L1 is modified according to the error of the error suppression signal.

6 Claims, 11 Drawing Sheets

US 7,463,090 B2

1
DRIVING DEVICE

This application is based upon and claims the benefit of priority from the first Japanese Patent Application No. 2006-135596, filed on May 15, 2006 and the second Japanese Patent Application No. 2007-042485, filed on Feb. 22, 2007, the entire contents of which are incorporated herein by reference.

BACKGROUND OF THE INVENTION

1. Field of the Invention

The present invention relates to a driving device for driving load such as a speaker.

2. Description of the Related Art

Information apparatuses such as a mobile telephone have products having functions in which various types of functions are incorporated. Since these information apparatuses are mostly driven by batteries, a time of continuous use is limited. In consideration of many more functions in the near future, it is desirable that each component incorporated in products become consume lower power. For example, as components incorporated in mobile telephones consume higher power, a transmitting power amplifier and a backlight for liquid crystal display are included. Further, a speaker that reproduces sounds such as ring tone melody is one of the components. In recent years, as one of the measures for reduction of power consumption, there are products that the conventional class AB amplifier is replaced by the switching amplifier having high power efficiency in the speaker drive method.

FIG. 8 shows an exemplary configuration of a driving device constructed as a switching amplifier (class D amplifier) having inductive load such as a dynamic speaker as load (see e.g. U.S. Pat. Nos. 614,297 and 6,262,632).

The driving device 3 includes a driving circuit 20 outputting an output signal Vp-n2, an error suppression circuit 11 generating a first error suppression signal Vout1, a pulse width modulation circuit (PWM) 12 as a pulse modulation means outputting switching control signals Vp1 and Vp2 corresponding to pulse modulation signals, a gate driver 13, and low pass filters (LPF1, LPF2) 14 and 15 as a first feedback means.

The driving circuit 20 includes a switching circuit 100 having a plurality of switching elements 101, 102, 103 and 104, and inductive load L1 as the load is connected at terminals between connection points OUTP and OUTN.

Each of the switching elements 101, 102, 103 and 104 (i.e. transistors such as MOSFET) has a first terminal 40 (connection points OUTP and OUTN) connected to one output terminal 50 of the inductive load L1, a second terminal 41 connected to the power source (Vcc) or ground terminal, and a third terminal 42 to which switching control signals Vp1$p$, Vp1$n$, Vp2$p$ and Vp2$n$ are inputted.

The switching circuit 100 control the switching elements 101, 102, 103 and 104 with on/off behavior based on the switching control signals Vp1$p$, Vp1$n$, Vp2$p$ and Vp2$n$, respectively, thus controlling supplying of electric power to the inductive load L1. Output terminals 50 and 51 at connection points (OUTP and OUTN) between the terminal of the inductive load L1 and the each first terminal 40 of the switching elements 101, 102, 103 and 104 output an output signal Vp-n2 as a voltage across the inductive load L1.

The low pass filters (LPF1, LPF2) 14 and 15 feed back output signal Vp-n2 at the output terminals 50 and 51 of the driving circuit 20 to terminals 9$a$ and 9$b$ via feedback resistors RF1 and RF2 of the error suppression circuit 11. Here, as the signals fed back, output signals V2$a$ and V2$b$ are used.

2
The error suppression circuit 11 is constructed as an integrator including a differential amplifier circuit 111, a capacitor C2 connected between terminals 9$a$ and 10$a$, a capacitor C3 connected between terminals 9$b$ and 10$b$, input resistors RS1 and RS2 connected between input terminals 8$a$ and 9$a$ and between input terminals 8$b$ and 9$b$, respectively, and the feedback resistors RF1 and RF2 connected to the terminals 9$a$ and 9$b$, respectively. The error suppression circuit 11 compare the amplitude of output signals V2$a$ and V2$b$ fed back via the low pass filters (LPF1, LPF2) 14 and 15 with the amplitude of input signal Vin inputted to the input terminals 8$a$ and 8$b$, thus detecting an error of amplitude between signals. Then, a corrected voltage (i.e. first error suppression signal Vout1 is produced such that the detected error of amplitude between signals is suppressed. Here, continuous processing is performed but discrete processing is not performed.

Here, in FIG. 8, in order to evaluate input reproducibility of the switching amplifier, low pass filters (LPF3, LPF4) 16 and 17 are connected to the output terminals 50 and 51 of the driving circuit 20. Then, output signal Vp-n20 is produced from the output terminals 52 and 53 of the low pass filters (LPF3, LPF4) 16 and 17. In this case, these low pass filters (LPF3, LPF4) 16 and 17 are not necessitated structure elements in the driving device 3, and are no relationship with the operation as a switching amplifier.

The circuit operation is as follows. The pulse width modulation circuit (PWM) 12 produces switching control signals Vp1 and VP2 based on the produced first error suppression signal Vout1. Then, the produced switching control signals Vp1 and VP2 are inputted via the gate driver 13 to the third terminal 42 of the switching elements 101, 102, 103 and 104, thus performing on/off behavior of the switching elements 101, 102, 103 and 104 to control supplying of a current I to the inductive load L1.

FIG. 9 shows the internal configuration of the pulse width modulation circuit (PWM) 12 and gate driver 13.

The pulse width modulation circuit (PWM) 12 includes a triangular wave generator 90 and two comparators 91$a$ and 91$b$. The triangular wave generator 90 generates a triangular wave as a reference signal. The produced triangular wave is inputted as the comparison processing of the comparators 91$a$ and 91$b$. The gate driver 13 includes two dead time generation circuits 92$a$ and 92$b$, and two driving circuits 93$a$ and 93$b$.

FIG. 10 shows a timing chart of waveforms of various signals outputted from the pulse width modulation circuit (PWM) 12 and gate driver 13 shown in FIG. 9.

In the pulse width modulation circuit (PWM) 12, the first error suppression signal Vout1 outputted from the terminals 10$a$ and 10$b$ of the error suppression circuit 11 is compared with a triangular wave 302 being the reference signal, and pulse modulation signals Vp1 and Vp2 are outputted as the comparison result.

In the gate driver 13, pulse modulation signal Vp1 is inputted to the dead time generation circuit 92$a$, and the dead time generation circuit 92$a$ delays the rise or fall time of pulse modulation signal Vp1 by a dead time. Then, the delayed signal is buffered by the drive circuit 93$a$ and outputted as switching control signals Vp1$p$ and Vp1$n$. The transistors 101 and 102 are controlled based on these switching control signals. Vp1$p$ and Vp1$n$.

Similarly, pulse modulation signal Vp2 is inputted to the dead time generation circuit 92$b$, and the dead time generation circuit 92$b$ delays the rise or fall time of pulse modulation signal Vp2 a dead time. Then, the delayed signal is buffered by the drive circuit 93$b$ and outputted as switching control signals Vp2p and Vp2n. The transistors 103 and 104 are controlled based on switching control signals Vp2p and Vp2n.

In this manner, in the gate driver 13 of FIG. 10, a non-overlap period (dead time) of about several ns to several 10 ns is inserted in pulse modulation signals Vp1 and Vp2, respectively. Thus, the number of output lines for switching control signals Vp1p, Vp1n, Vp2p and Vp2n become four. As a result, the pair of transistors 101 and 102, or the pair of transistors 103 and 104 performs on-behavior simultaneously at the moment when each signal varies, thus preventing large current from flowing from the power source to the ground.

In the switching amplifier of FIG. 8, output signals V2a and V2b having distorted waveforms due to various error generation factors, such as rise delay of switching signal, fluctuations of power source voltage, and voltage error between the switching waveforms due to a mismatch between the on-resistances of the switching elements, are fed back to the terminals 9a and 9b. Then, an error component between this fed back output signals V2a and V2b and input signal Vin is detected by the error suppression circuit 11. That error is suppressed based on feedback loop gain, and first error suppression signal Vout1 is generated as the voltage in which the error is corrected. This first error suppression signal Vout1 is inputted to the pulse width modulation circuit (PWM) and processed.

FIG. 11 shows a variation of signal level of input signal waveform inputted to the pulse width modulation circuit (PWM) 12. Here, as an input signal waveform in first error suppression signal Vout1 inputted from the error suppression circuit 11 to the pulse width modulation circuit (PWM) 12, the signal waveform at the terminal 10a of the error suppression circuit 11 is shown.

While input signal waveform 300 indicates an input signal waveform under the scheme of FIG. 8, input signal waveform 301 indicates an expected input signal waveform having high input reproducibility. In FIG. 11, the input signal waveform 300 is shifted to an error of Δ from the expected value, compared to the expected input signal waveform 301. Here, reference numeral 302 denotes a triangular wave being the reference signal used when producing a pulse width modulation signal.

As described above, in the pulse width modulation circuit (PWM) 12 as shown in FIG. 8, only the correction of input signal waveform 300 based on feedback loop gain cannot suppress waveform distortion. Then, a predetermined signal having high input reproducibility can not be outputted, thus producing distortion in the output waveform of output signal Vp-n2 (for example, distortion in the waveform illustrated in FIG. 4(C) described later). As a result, in the case that a high-performance product is requested, specification cannot be satisfied.

In the switching amplifier shown in FIG. 8, output signals V2a and V2b are fed back, whereby signal waveform distortion is suppressed by feedback loop gain. However, it is desirable to further improve the input reproducibility of output signal.

SUMMARY OF THE INVENTION

Accordingly, an object of the present invention is to provide a driving device which effectively suppresses distortion of signal waveform outputted by a switching amplifier and further can generate a signal waveform in which input reproducibility of output signal has been improved.

According to the present invention, there is provided a driving device for controlling electric power to load based on switching elements, the device comprising: a driving means having a switching circuit including a plurality of switching elements connected to the load; a first feedback means for feeding back an output signal at an output terminal of the load to an input terminal to which an input signal is inputted; an error suppression means, connected to the input terminal, for comparing the output signal fed back via the first feedback means with the input signal to detect an error between signals, and producing an error suppression signal that the error is corrected; a control means for controlling switching of operation of the plurality of the switching elements in the driving means based on the error suppression signal; and a second feedback means for detecting a inclination component of a signal outputted from the error suppression means, and feeding back the inclination component to an input terminal of the error suppression means, wherein the error suppression means compares the input signal with a combination signal that the inclination component fed back via the second feedback means is added to the output signal fed back via the first feedback means to detect an error between signals, and produces an error suppression signal in which the error is corrected.

Further, according to the present invention, the second feedback means is a differentiation circuit that differentiates a signal outputted from the error suppression means.

Further, according to the present invention, the second feedback means is a high-pass filter or a band pass filter.

Further, according to the present invention, the load is capacitive load or inductive load.

Further, according to the present invention, the load is a piezoelectric speaker or a dynamic speaker.

Also, according to the present invention, an information apparatus comprising: the driving device for controlling electric power to load based on the switching elements; an information processing portion, having a communication function and an information processing function, for controlling the driving device; and a battery for supplying electric power to the driving device and the information processing portion.

According to the present invention, comparing output signal with an input signal to detect an error between signals, wherein an output signal at the output terminals across the load is fed back to the input terminal; producing a first error suppression signal in which the detected error is corrected so that the detected error is suppressed; detecting a inclination of the first error suppression signal; and producing a second error suppression signal in which the inclination error is corrected so as to suppress the inclination error contrast to the input signal due to the detected inclination signal; and supplying of electric power to the load according to the error suppression signal, thus improving input signal reproducibility in the output signal waveform.

Also, according to the present invention, the driving device is incorporated into an information apparatus for controlling electric power to load. Accordingly, the sound quality of a speaker can be highly improved, for example.

Further, features of the present invention will become apparent from the following description of exemplary embodiments (with reference to the attached drawings).

DESCRIPTION OF THE EMBODIMENTS

Figure 1:
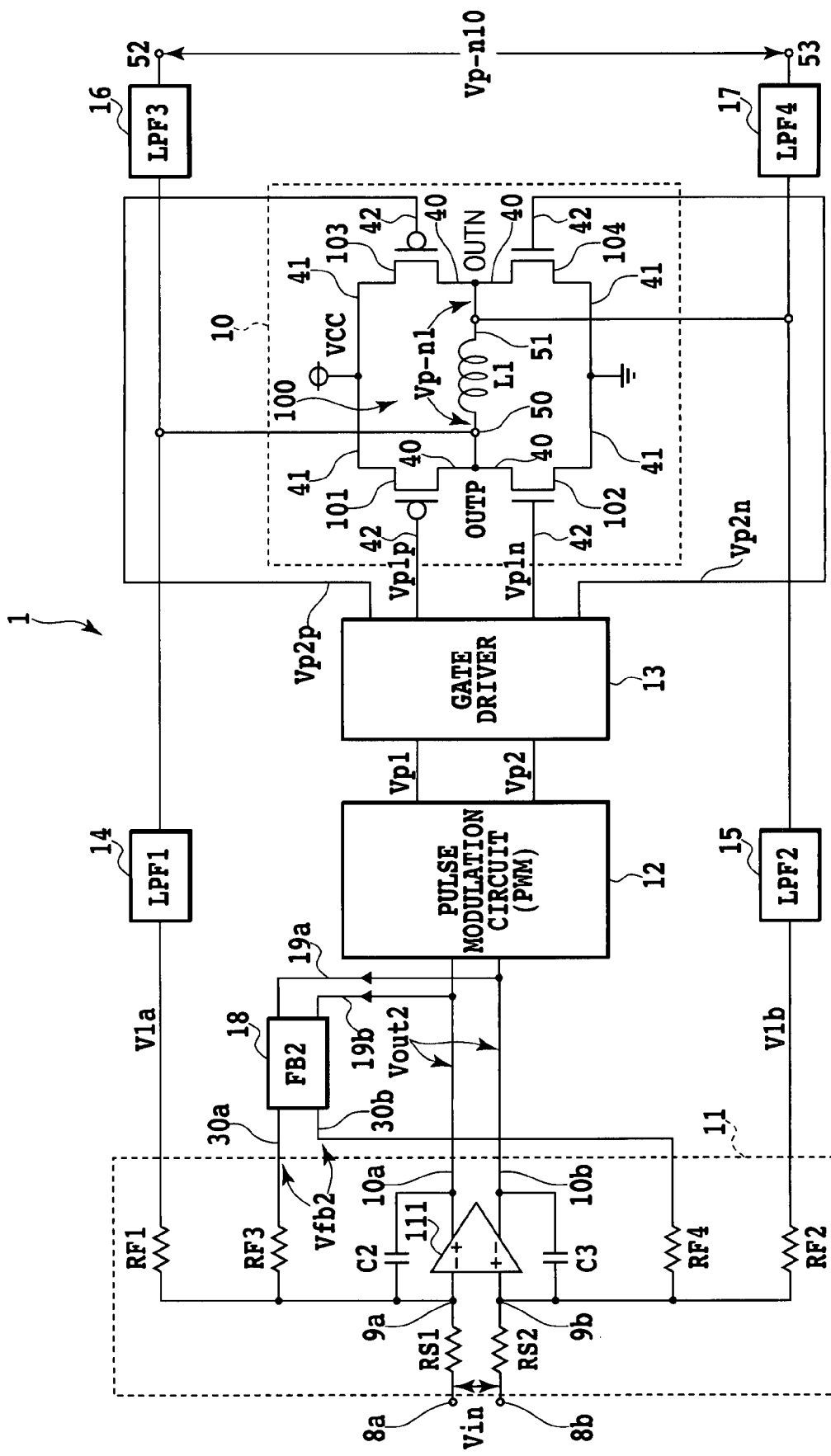
FIG. 1 is a circuit diagram showing an exemplary configuration of a driving device including a switching amplifier, according to a first embodiment of the present invention.

The present invention will be described in detail below with reference to the drawings showing embodiments thereof.

FIRST EXAMPLE

A first embodiment of the present invention will be described with reference to FIGS. 1 to 5. The same reference numerals are applied to the parts corresponding to those of FIG. 8, and an explanation thereof is omitted.

In this embodiment, a description will be given regarding an example where the driving device according to the present invention is constructed as a switching amplifier (class D amplifier) having inductive load such as a dynamic speaker as load.

(Circuit Configuration)

FIG. 1 illustrates an exemplary configuration in which the driving device 1 used as a switching amplifier is provided with an arithmetic circuit 18 as a second feedback means.

The driving device 1 includes a driving circuit 10 outputting an output signal Vp-n1, an arithmetic circuit 18 detecting an inclination of a first error suppression signal Vout1 to generate an inclination signal, an error suppression circuit 11 by which, when the inclination signal of first error suppression signal Vout1 is fed back, a second error suppression signal Vout2 can be further generated, a pulse width modulation circuit (PWM) 12 as a pulse modulation means outputting pulse modulation signals Vp1 and Vp2, a gate driver 13 outputting switching control signals Vp1p, Vp1n, Vp2p and Vp2n to respective switching elements 101, 102, 103 and 104 of the driving circuit 10, and low pass filters (LPF1, LPF2) 14 and 15 as a first feedback means. Here, the error suppression circuit 11 is constructed as an integrator.

The driving circuit 10 has a switching circuit 100 including a plurality of the switching elements 101, 102, 103 and 104; inductive load L1 as the load is connected at terminals between connection points OUTP and OUTN of the driving circuit 10.

Here, in order to evaluate input reproducibility of the switching amplifier, low pass filters (LPF3, LPF4) 16 and 17 are connected to the output terminals 50 and 51 of the driving circuit 10, for the sake of convenience, whereby an output signal Vp-n10 is extracted from output terminals 52 and 53 of the low pass filters (LPF3, LPF4) 16 and 17. In this case, these low pass filters (LPF3, LPF4) 16 and 17 are not necessitated structure elements in the driving device 1, and are no relationship with the operation as a switching amplifier.

The configuration of each portion will now be described.

The arithmetic circuit 18 is connected between the error suppression circuit 11 and the pulse width modulation circuit (PWM) 12. Connection lines 19a and 19b on the input side is connected to an output line in which first error suppression signal Vout1 is outputted from the error suppression circuit 11. Connection lines 30a and 30b on the output side thereof are connected to resistors RF3 and RF4 of the error suppression circuit 11.

The arithmetic circuit 18 is a circuit for detecting a signal inclination such as a differentiation circuit but the configuration is not limited to this circuit. As another example, the arithmetic circuit 18 may be constituted of a high-pass filter having a frequency component higher than a predetermined set cutoff frequency, or a band pass filter having a limited pass-band.

Figure 2:
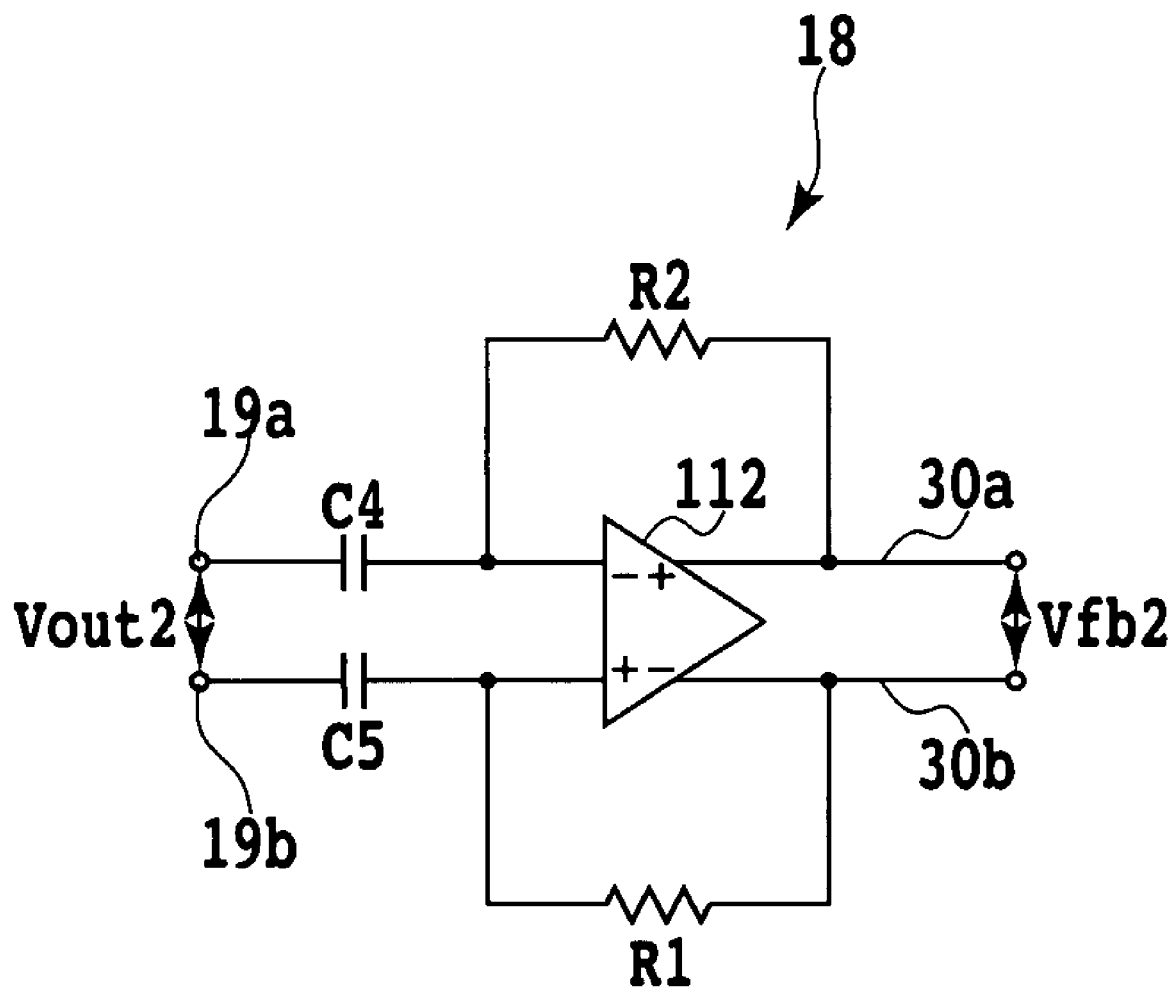
FIG. 2 is a differentiating circuit showing an example of arithmetic circuit 18.

FIG. 2 shows a differentiation circuit as an example of the arithmetic circuit 18. The arithmetic circuit 18 includes a differential amplifier circuit 112, capacitors C4 and C5 connected between the input terminals 19a and 19b and the input terminals of the differential amplifier circuit 112 respectively, and resistors R1 and R2 connected between the input terminals and the output terminals 30a and 30b respectively. In this case, after an inclination is detected by differentiating an input signal, a differentiation signal containing this detected inclination is outputted.

After the arithmetic circuit 18 detects a inclination of first error suppression signal Vout1 outputted from the error suppression circuit 11, a detection signal Vfb2 containing the detected inclination is inputted to the error suppression circuit 11 together with fed back output signals V1a and V1b.

Then, in the error suppression circuit 11, output signals V1a and V1b containing the inclination of detection signal Vfb2 are compared with the inclination of input signal Vin. A second error suppression signal Vout2 is produced so that the inclination error between signals is suppressed.

Here, this input signal Vin may be a differential signal, or a single end that the input terminal 8a or 8b is connected to a reference signal level. Further, the error suppression circuit 11 may be a single end configuration. In this case, OUTP and OUTN as differential output are changed to a single end and the output from the single end terminal may be fed back to the error suppression circuit 11.

Also, the driving circuit 10 may have a full-bridge configuration or a half-bridge configuration. In a half-bridge configuration, one terminal of the inductive load L1 is connected to the ground. In this case, the driving circuit 10 is comprised of two switching elements 101 and 102 (or 103 and 104).

(Circuit Operation)

First an outline of operation of the driving device 1 shown in FIG. 1 will be described.

Figure 3:
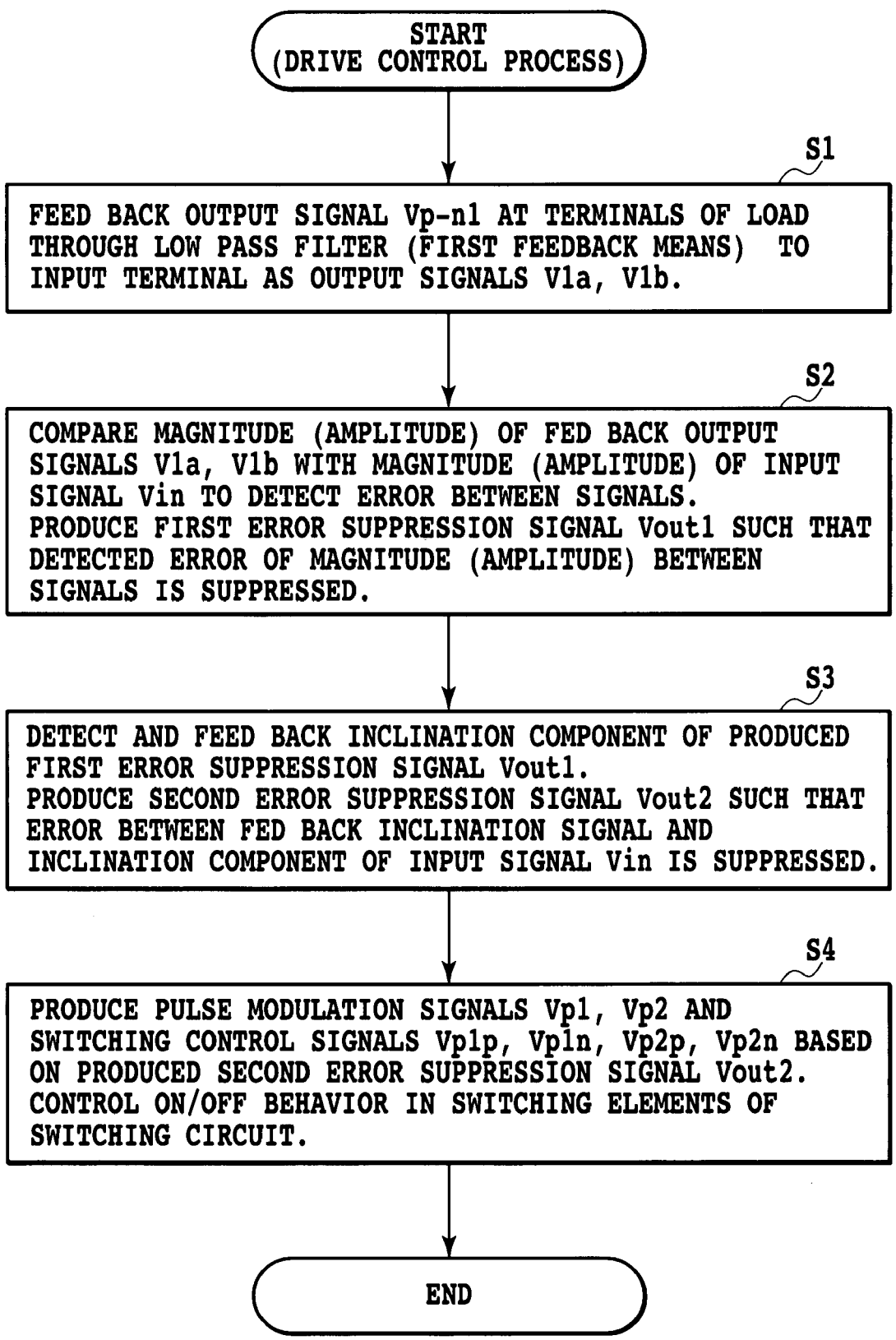
FIG. 3 is a flowchart explaining the basic circuit operation of the driving device.

FIG. 3 is a flowchart explaining the basic circuit operation of the driving device 1.

In step S1, an output signal Vp-n1 at the output terminals 50 and 51 of the connection points between the terminals of the inductive load L1 and the first terminal 40 of the switching elements 101, 102, 103 and 104 is fed back as output signals V1a and V1b to the input terminals 9a and 9b via the low pass filters (LPF1, LPF2) 14 and 15. The voltage values of the fed back output signals V1a and V1b are accumulated across capacitors C2 and C3 of the differential amplifier circuit 111.

In step S2, the magnitude (amplitude) of the fed back output signals V1a and V1b is compared with the magnitude (amplitude) of input signal Vin to detect an error of magnitude (amplitude) between signals, and a first error suppression signal Vout1 is produced such that the detected error of amplitude between the signals is suppressed.

In step S3, detection signal Vfb2 containing a inclination component of first error suppression signal Vout1 detected by the arithmetic circuit 18 constituting the second feedback means is inputted via the resistors RF3 and RF4 to the error suppression circuit 11. A second error suppression signal Vout2 is produced such that the error of the inclination component of input signal Vin is suppressed.

In step S4, the pulse width modulation circuit (PWM) 12 produce pulse modulation signals Vp1 and Vp2 having modulated pulse width based on the generated second error suppression signal Vout2. The produced pulse modulation signals Vp1 and Vp2 are inputted to the third terminal 42 of the switching elements 101, 102, 103 and 104 via the gate driver 13. Thus, the switching elements 101, 102, 103 and 104 perform on/off behavior to control supplying of a current I to the inductive load L1.

(Inclination)

The word "inclination" means a magnitude of the voltage amplitude variation contrast to time variation of continuous signal.

For example, detection signal Vfb2 is a signal produced by differentiating first error suppression signal Vout1 outputted from the arithmetic circuit 18. This output differentiation signal Vfb2 represents a variation of inclination of the first error suppression signal Vout1. As to the output, a steeper inclination becomes a larger variation.

(Second Error Suppression Signal)

The operation of second error suppression signal Vout2 will now be described.

Figure 4:
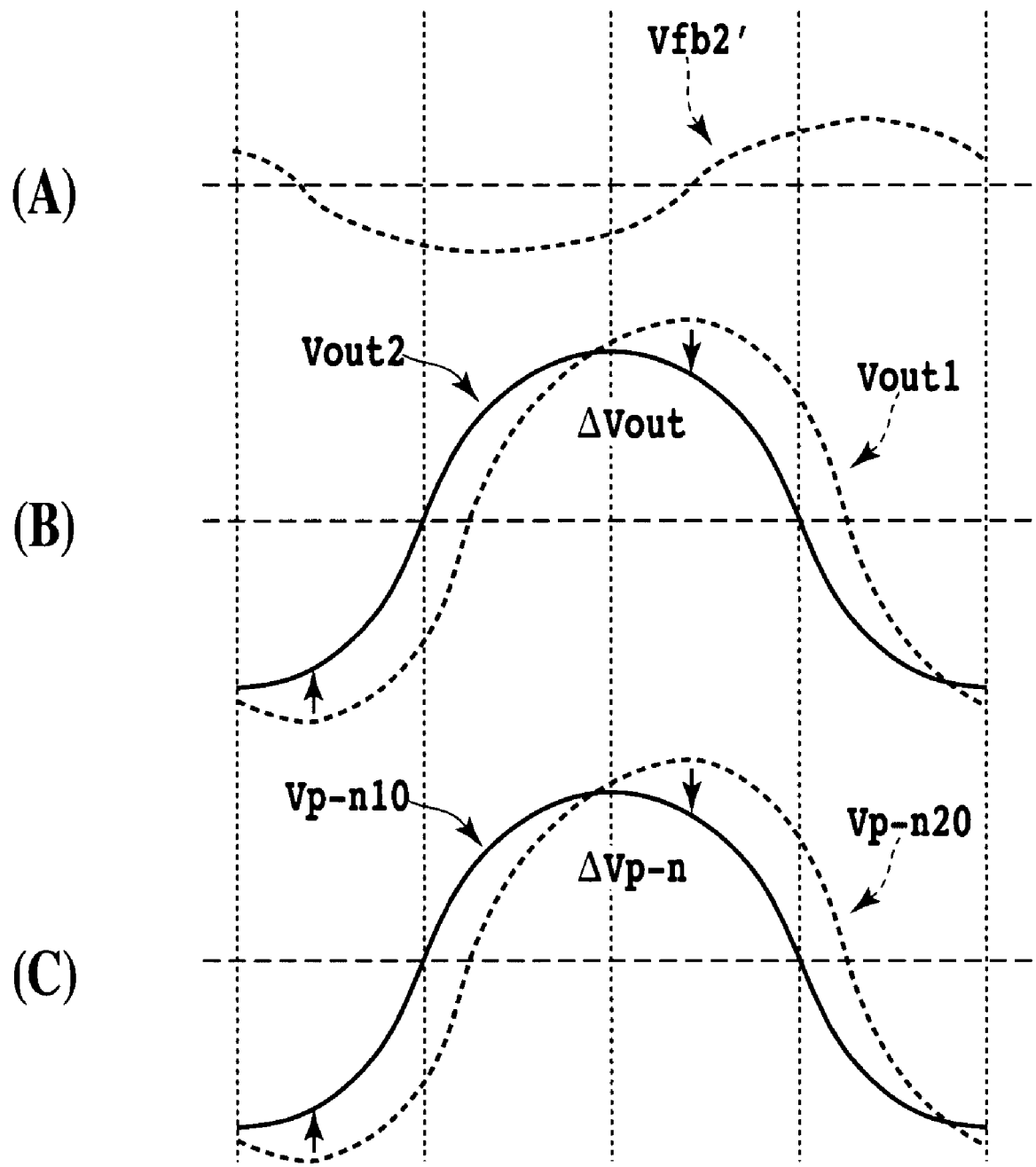
FIG. 4 is a waveform diagram showing waveforms of various signals generated in respective circuits of the driving device.

(A) to (C) of FIG. 4 show waveforms of various signals produced in each circuit portion of the driving device 1.

In the above described driving device 1 of FIG. 1, output signal Vp-n1 outputted from the driving circuit 10 is inputted to the low pass filters 14 and 15 constituting the feedback circuit. Then, output signals V1a and V1b fed back via the low pass filters 14 and 15 is compared with input signal Vin. As a result, by using on a loop gain including the gain of the differential amplifier circuit 111, first error suppression signal Vout1 is produced. The first error suppression signal Vout1 is featured in that the error component is suppressed between the fed back output signals V1a and V1b and input signal Vin.

This produced first error suppression signal Vout1 varies the duty ratio of switching control signals Vp1 and VP2 as pulse modulation signals, but a waveform error component which cannot be suppressed enough by the error suppression circuit 11 still remains. This error component contained in first error suppression signal Vout1 can be regarded as a difference between the inclination of output signal waveform and the inclination of input signal waveform.

Thus, according to the present embodiment, first error suppression signal Vout1 containing that difference of inclination component is sent to the arithmetic circuit 18 constituted of a differentiation circuit. Then, an output differentiation signal Vfb2 as the inclination component is inputted via the feedback resistors RF3 and RF4 to the error suppression circuit 11.

Figure 5:
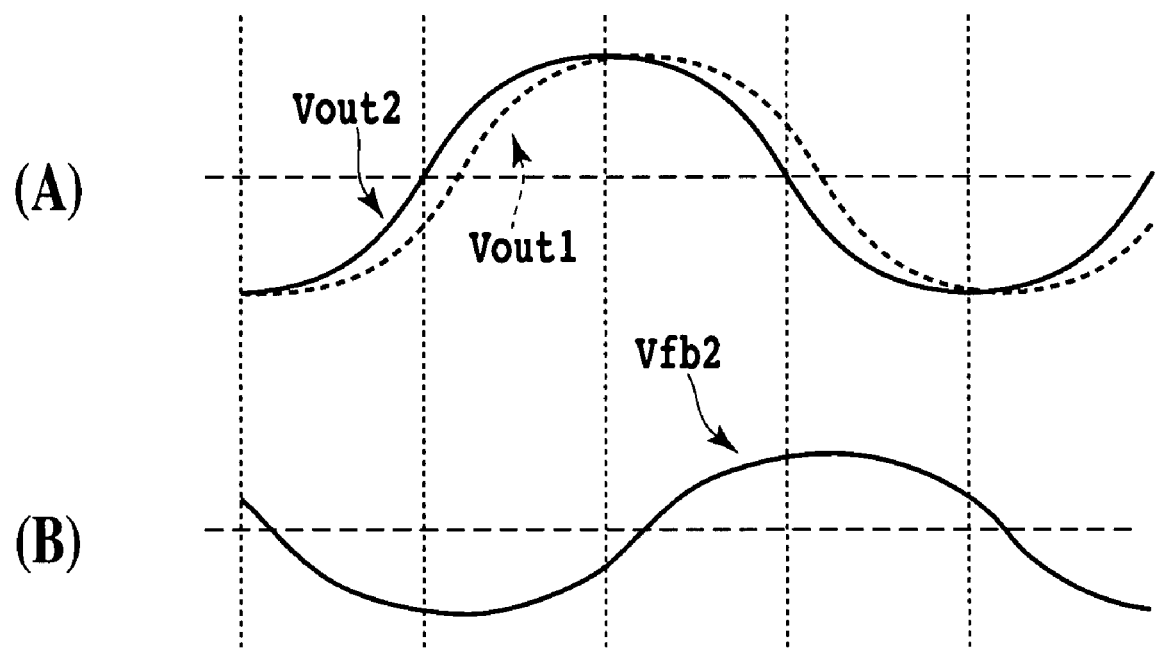
FIG. 5 is a waveform diagram showing a waveform obtained when a waveform inputted to the arithmetic circuit is differentiated.

When the arithmetic circuit 18 is a differentiation circuit, detection signal Vfb2 is a reverse signal by inverting a differential signal obtained by differentiating first error suppression signal Vout1. For example, as shown in (A) of FIG. 5, when first error suppression signal Vout1 is a sine wave, a waveform like the detection signal Vfb2 shown in (B) of FIG. 5 is obtained.

The error suppression circuit 11 calculates a variation component of detection signal Vfb2 to output second error suppression signal Vout2. When first error suppression signal Vout1 is a waveform without distortion, second error suppression signal Vout2 becomes a waveform having a phase lead corresponding to the magnitude of variation of detection signal Vfb2 produced by first error suppression signal Vout1, and thus there is no variation in the waveform quality.

When first error suppression signal Vout1 is distorted, as shown in (B) of FIG. 4, in a way that the inclination becomes a smooth curve in a delayed manner around the peak in a direction where the signal waveform varies from the zero cross point to the peak. Then, a voltage level of detection signal Vfb2' shown in (A) of FIG. 4 raises corresponding to the steep inclination, as compared to the waveform of detection signal Vfb2 shown in (B) of FIG. 5 observed when there is no distortion.

When this detection signal Vfb2' is inputted to the error suppression circuit 11, the addition amount is large only at points where the inclination of signal waveform is steep. Thus, the inclination becomes a smooth curve only at the points where the inclination of signal waveform is steep. Then, second error suppression signal Vout2 is produced, as shown in (B) of FIG. 4, thus improving a distortion waveform. Also, the error suppression circuit 11 corrects the signal level corresponding to the increment by the addition of detection signal Vfb2' is corrected via the first feedback means (low pass filters 14 and 15).

Here, a description will be given using formulas. When first error suppression signal Vout1 is expressed as $a \times \sin(\omega t)$, detection signal Vfb2' is expressed as $b \times \cos(\omega t)$, and second error suppression signal Vout2 being the corrected signal is expressed as $r \times \sin(\omega t + \alpha)$, $r = \sqrt{(a^2 + b^2)}$, $\alpha = \tan^{-1}(b/a)$. Accordingly, when there is no harmonic distortion, the input signal is faithfully reproduced (only the amplitude and phase being slightly varied). While only when there is harmonic distortion, the addition amount of the portion in which the inclination is steeper than the input signal as the distortion factor is larger than when there is no distortion. Thus, a correction is made so that the inclination becomes a smooth curve, thus reducing the distortion component.

Figure 8:
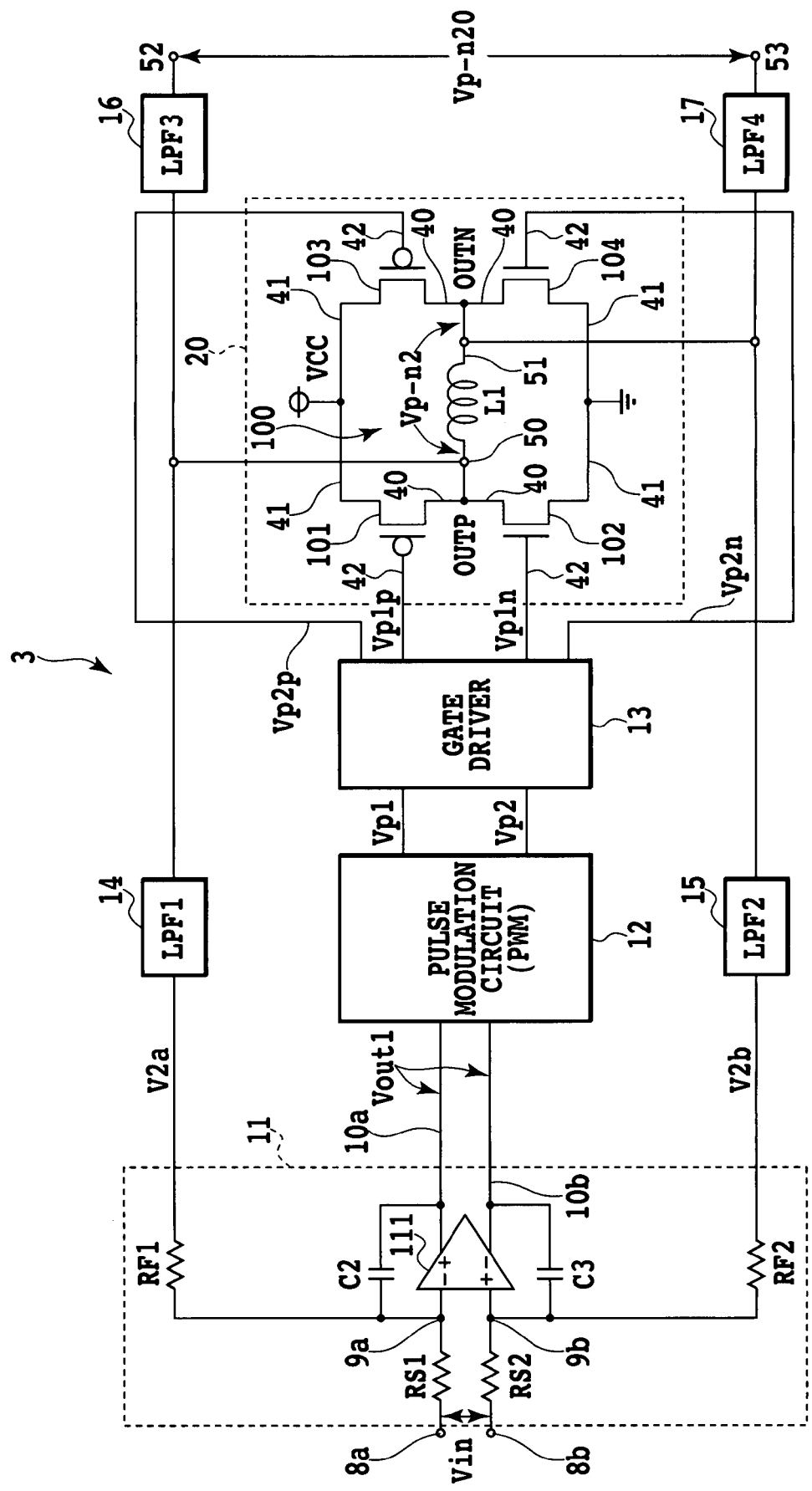
FIG. 8 is a circuit diagram showing an exemplary configuration of a driving device including a switching amplifier, according to conventional art.
Figure 9:
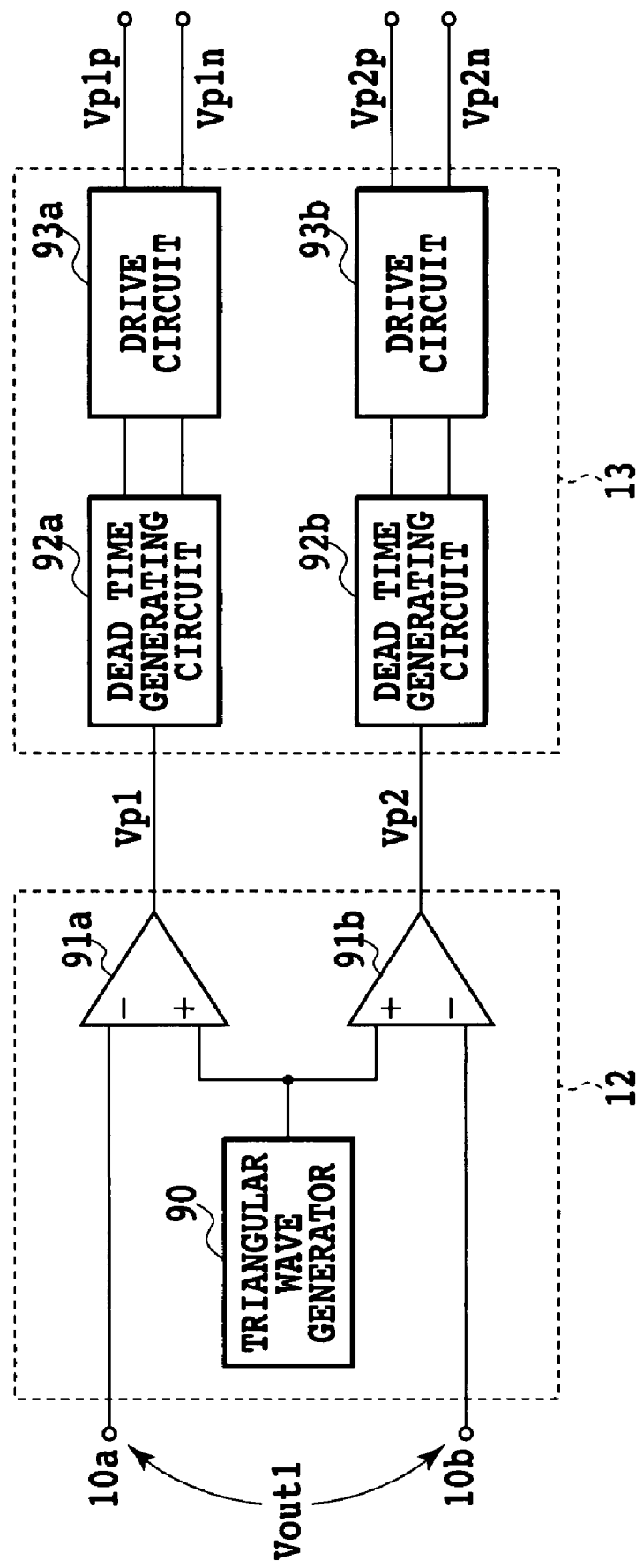
FIG. 9 is a block diagram showing a configuration of a pulse modulation circuit and gate driver.
Figure 10:
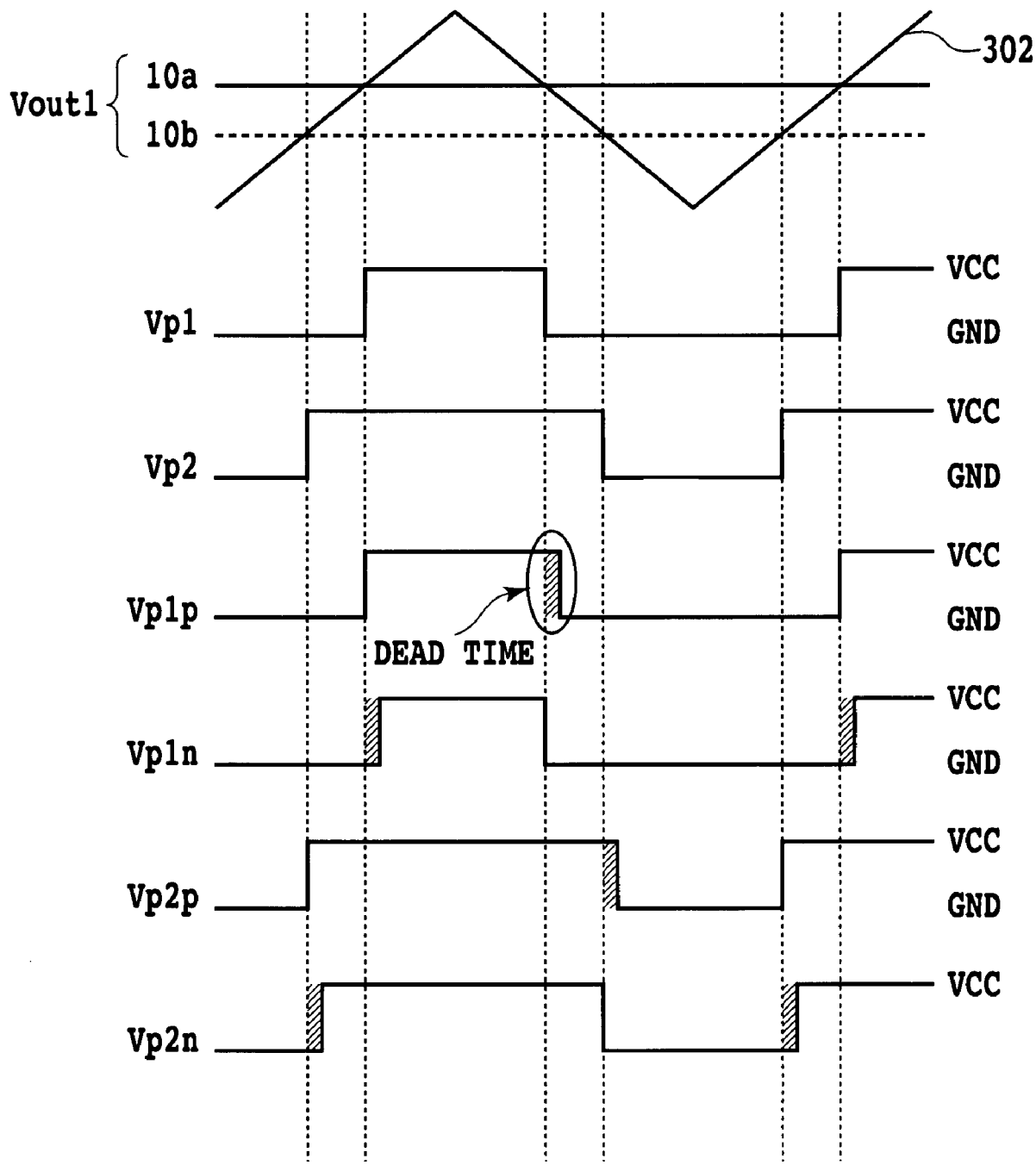
FIG. 10 is a timing chart of waveforms of various signals generated from the pulse width modulation circuit (PWM) 12 and gate driver 13.
Figure 11:
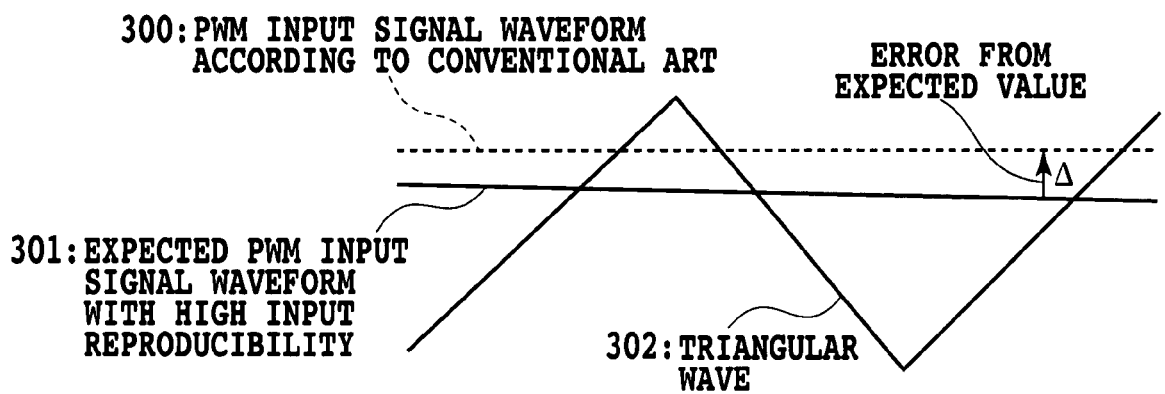
FIG. 11 is a waveform diagram showing a variation of signal level of input signal waveform inputted to the pulse width modulation circuit (PWM).

As means for verifying the improvement effect, in order to evaluate input reproducibility, output signal Vp-n10 from the low pass filters 16 and 17 connected to the output terminals 50 and 51 of the driving circuit 10 of FIG. 1 is compared with output signal Vp-n20 from the low pass filters 16 and 17 connected to the output terminals 50 and 51 of the driving circuit 20 of FIG. 8. As shown (C) of in FIG. 4, output signal Vp-n10 which is corrected by ΔVp-n corresponding to the error of inclination between the signals can be outputted compared to output signal Vp-n20.

That is, second error suppression signal Vout2 is produced by the arithmetic circuit 18 as the second feedback means, thus correcting the waveform distortion at the inductive load L1 to improve the input reproducibility.

As described above, in the switching amplifier of FIG. 8 including only the first feedback means, when the values of resistors and capacitors included the circuit are selected as practical optimum values capable of being incorporated in the IC, the value of THD (Total Harmonic Distortion), which is one of evaluation methods of waveform quality, is about 65 to 70 dB at best.

In contrast, in the switching amplifier of FIG. 1 having the arithmetic circuit 18 as the second feedback means according to the present invention, when practical optimum values capable of being incorporated in the IC are selected, as to the signal waveform in the time domain, the sharp portion around the peak of sine wave is a smooth curve as shown in (C) of FIG. 4, thus improving input signal reproducibility.

In view of the frequency domain, distortion components are lowered totally in even-order and odd-order, thus improving THD up to about 80 dB. In comparison with THD of the switching amplifier of FIG. 8 as only the first feedback means, THD can be improved about 10 dB.

As the size of IC chip, in order to cope with stereo systems used in recent years, a size of about 2 mm×2 mm may be set in case that two channels are incorporated in switching amplifiers.

SECOND EXAMPLE

A second embodiment of the present invention will be described with reference to FIG. 6.

In this example, the driving device according to the present invention is an example of a switching amplifier (class D amplifier) having capacitive load such as a piezoelectric speaker. The same reference numerals are applied to the parts corresponding to those of the first example described above and an explanation thereof is omitted.

Figure 6:
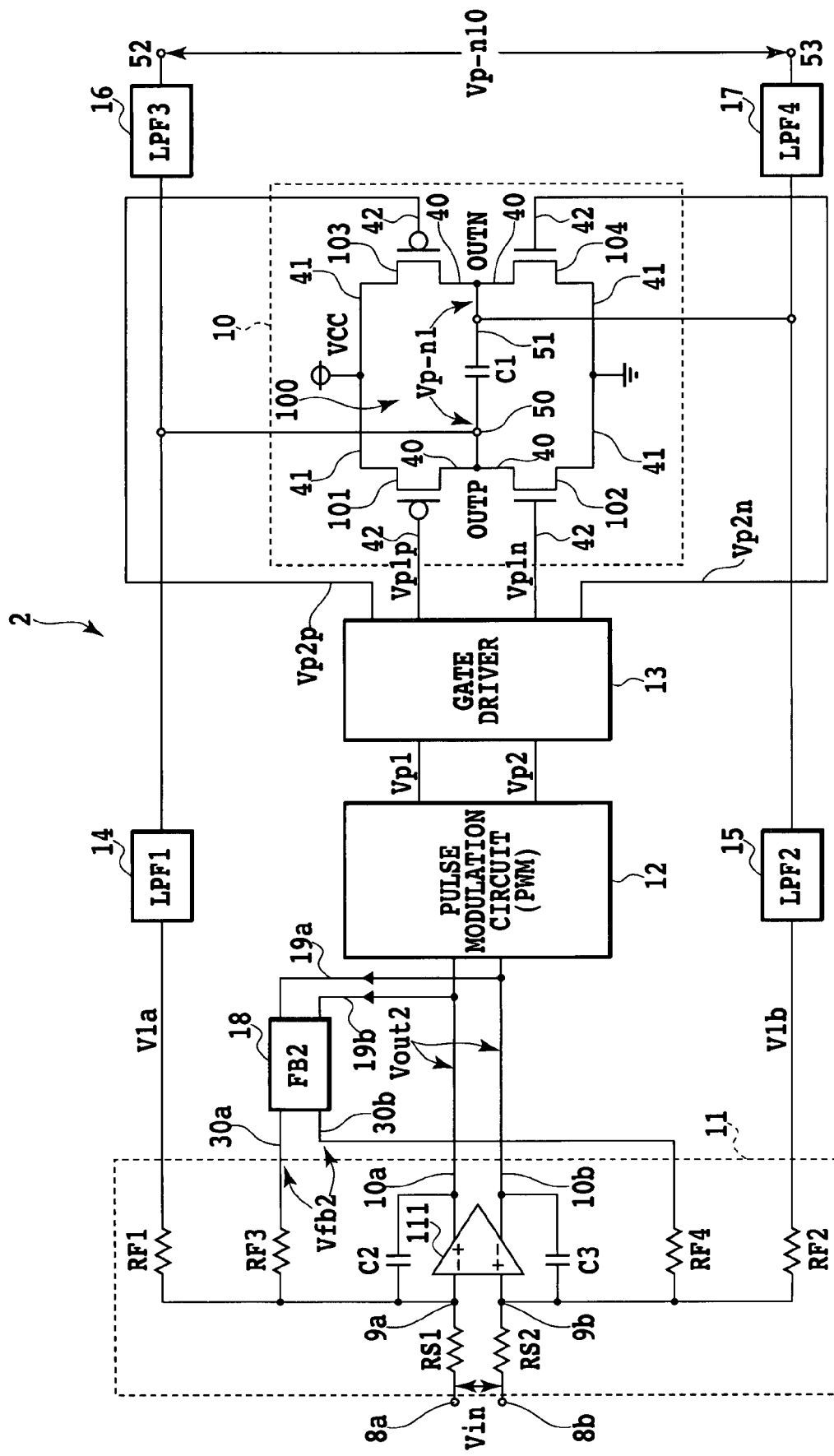
FIG. 6 is a circuit diagram showing an exemplary configuration of a driving device including a switching amplifier, according to a second embodiment of the present invention.

FIG. 6 shows an example in which a driving device 2 of a switching amplifier is provided with an arithmetic circuit 18 as a second feedback means.

The driving circuit 10 has a switching circuit 100 including a plurality of switching elements 101, 102, 103 and 104. Capacitive load C1 as load is connected at terminals between connection points OUTP and OUTN of the driving circuit 10.

Only load is different from that of the first embodiment shown in FIG. 1 and the other parts are identical, including the arithmetic circuit 18.

The basic circuit operation of the driving device 1 will now be described with reference to the flowchart of FIG. 3 described above.

In step S1, an output signal Vp-n1 is produced at the output terminals 50 and 51 between the terminal of capacitive load C1 and the first terminal 40 of the switching elements 101, 102, 103 and 104. The produced output signal Vp-n1 is fed back as output signals V1$a$ and V1$b$ to the input side terminals 9$a$ and 9$b$ via the low pass filters (LPF1, LPF2) 14 and 15. The voltage values of output signals V1$a$ and V1$b$ are produced at capacitors C2 and C3 of the differential amplifier circuit 111.

In step S2, the magnitude (amplitude) of the fed back output signals V1$a$ and V1$b$ is compared with the magnitude (amplitude) of input signal Vin to detect an error of magnitude (amplitude) between signals. A first error suppression signal Vout1 is produced such that the detected error of amplitude between the signals is suppressed.

In step S3, detection signal Vfb2 containing a inclination component of first error suppression signal Vout1, detected by the arithmetic circuit 18 as the second feedback means, is inputted via the resistors RF3 and RF4 to the error suppression circuit 11. Thus, a second error suppression signal Vout2 is produced such that the error due to the inclination component of input signal Vin is suppressed.

In step S4, the pulse width modulation circuit (PWM) 12 produces pulse modulation signals Vp1 and Vp2 having modulated pulse width based on the generated second error suppression signal Vout2. The produced pulse modulation signals Vp1 and Vp2 are inputted to the gate driver 13 to produce switching control signals Vp1$p$, Vp1$n$, Vp2$p$ and Vp2$n$.

The switching control signals Vp1$p$, Vp1$n$, Vp2$p$ and Vp2$n$ outputted from the gate driver 13 are inputted to the third terminal 42 of the switching elements 101, 102, 103 and 104. Thus, the switching elements 101, 102, 103 and 104 perform on/off behavior respectively to control supplying of a current I to the capacitive load C1.

Accordingly, when the signal correction processing is performed based on second error suppression signal Vout2 produced from the arithmetic circuit 18 as the second feedback means, waveform distortion appearing at the capacitive load C1 is corrected, thus improving input reproducibility.

THIRD EXAMPLE

A third embodiment of the present invention will be described with reference to FIG. 7. The same reference numerals are applied to the parts corresponding to those of the above described embodiments, and an explanation thereof is omitted.

This example shows information apparatus including the above described driving device 1 of FIG. 1 or the driving device 2 of FIG. 6.

Figure 7:
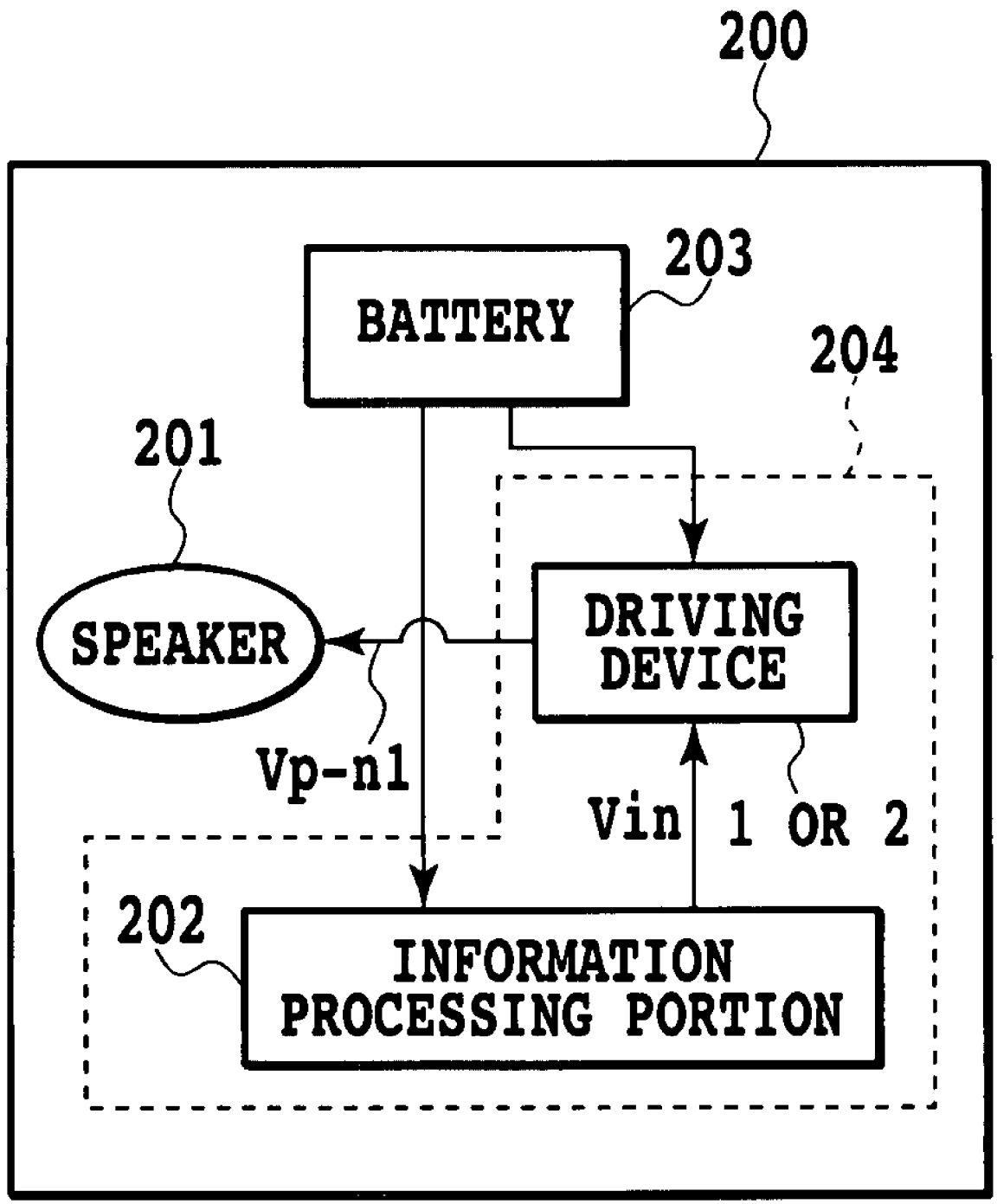
FIG. 7 is a block diagram showing an exemplary configuration of an information apparatus constituted of a personal digital assistant such as a mobile telephone, according to a third embodiment of the present invention.

FIG. 7 shows an exemplary configuration of an information apparatus constituted of a personal digital assistant 200 such as a mobile telephone.

The personal digital assistant 200 includes; a speaker 201 such as a dynamic speaker or a piezoelectric speaker as load (i.e. inductive load, capacitive load), the driving device 1 of FIG. 1 or the driving device 2 of FIG. 6 driving the speaker, an information processing portion 202 having a communication function, information processing function and manipulation processing function, and a battery 203 supplying electric power to the driving device 1 or driving device 2 and to the information processing portion 202. The information processing portion 202 outputs an input signal Vin to the driving device 1 or driving device 2. The driving device 1 or driving device 2 outputs an output signal Vp-n1 based on input signal Vin to the speaker 201 to supply electric power to the speaker 201. In this case, the driving device 1 or driving device 2, and the information processing portion 202 may be integrated as an LSI 204.

As described above, since the driving device 1 or driving device 2 is incorporated in the information apparatus 200 to control supplying of electric power to the load, sound quality of speaker can be dramatically improved, for example.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A driving device for controlling electric power to load based on switching elements, the device comprising:
   a driving means having a switching circuit including a plurality of switching elements connected to the load;

a first feedback means for feeding back an output signal at an output terminal of the load to an input terminal to which an input signal is inputted;

an error suppression means, connected to the input terminal, for comparing the output signal fed back via the first feedback means with the input signal to detect an error between signals, and producing an error suppression signal that the error is corrected;

a control means for controlling switching of operation of the plurality of the switching elements in the driving means based on the error suppression signal; and a second feedback means for detecting a inclination component of a signal outputted from the error suppression means, and feeding back the inclination component to an input terminal of the error suppression means, wherein the error suppression means compares the input signal with a combination signal that the inclination component fed back via the second feedback means is added to the output signal fed back via the first feedback means to detect an error between signals, and produces an error suppression signal in which the error is corrected.

2. The driving device according to claim 1, wherein the second feedback means is a differentiation circuit that differentiates a signal outputted from the error suppression means.

3. The driving device according to claim 1, wherein the second feedback means is a high-pass filter or a band pass filter.

4. The driving device according to claim 1, wherein the load is capacitive load or inductive load.

5. The driving device according to claim 1, wherein the load is a piezoelectric speaker or a dynamic speaker.

6. An information apparatus comprising:

a driving device according to any one of claims 1 to 5, controlling electric power to load based on switching elements;

an information processing portion, having a communication function and an information processing function, for controlling the driving device; and a battery for supplying electric power to the driving device and the information processing portion.

* * * * *